United States Patent [19]
Chu et al.

[11] Patent Number: 5,569,933
[45] Date of Patent: Oct. 29, 1996

[54] OPTICAL CONTROLLED RESONANT TUNNELING OSCILLATOR

[75] Inventors: Hye-Yong Chu; Pyong-Woon Park, both of Daejeon, Rep. of Korea

[73] Assignee: Electronics and Telecommunications Research Institute, Daejeon-shi, Rep. of Korea

[21] Appl. No.: 345,779

[22] Filed: Nov. 22, 1994

[30] Foreign Application Priority Data

Oct. 24, 1994 [KR] Rep. of Korea ............... 94-27166

[51] Int. Cl.[6] ............... H01L 29/06; H01L 31/0328; H01L 31/0336
[52] U.S. Cl. ............... 257/17; 257/21; 257/22; 257/23; 257/25; 257/184
[58] Field of Search ............... 257/25, 23, 17, 257/22, 15, 21, 184, 185

[56] References Cited

U.S. PATENT DOCUMENTS

| | | | |
|---|---|---|---|
| 5,225,692 | 7/1993 | Takeuchi et al. | 257/25 X |
| 5,229,823 | 7/1993 | Tanoue et al. | 257/25 |
| 5,266,814 | 11/1993 | Inata et al. | 257/21 X |
| 5,416,338 | 5/1995 | Suzuki et al. | 257/85 X |

OTHER PUBLICATIONS

Phase Locking Between Light Pulses and a Resonant Tunneling Diode Oscillator (Appl. Phys. Lett. 62(1). 4 Jan. 1993) pp. 13, 14 & 15, Lann et al.

*Primary Examiner*—William Mintel
*Attorney, Agent, or Firm*—Antonelli, Terry, Stout & Kraus

[57] ABSTRACT

An optical controlled resonant tunneling oscillator utilizing an oscillation variation characteristic of a resonant tunneling oscillator in accordance with a negative differential resistance, a series resistance and a static capacitance varied with an intensity of light when the light is incident on a resonant tunneling device having a double barrier quantum well structure and a method for fabricating the same are disclosed. The oscillator can modulate the frequency 2 or 3 levels in response to an intensity of an incident light as compared with the method of a conventioal photoelectric system that modulates the frequency in response to ON/OFF of an electric signal, thereby simplifying the system. The oscillator controls the resonant tunneling at the high speed by light, thereby enabling processing a signal of tens to hundreds GHz.

5 Claims, 6 Drawing Sheets

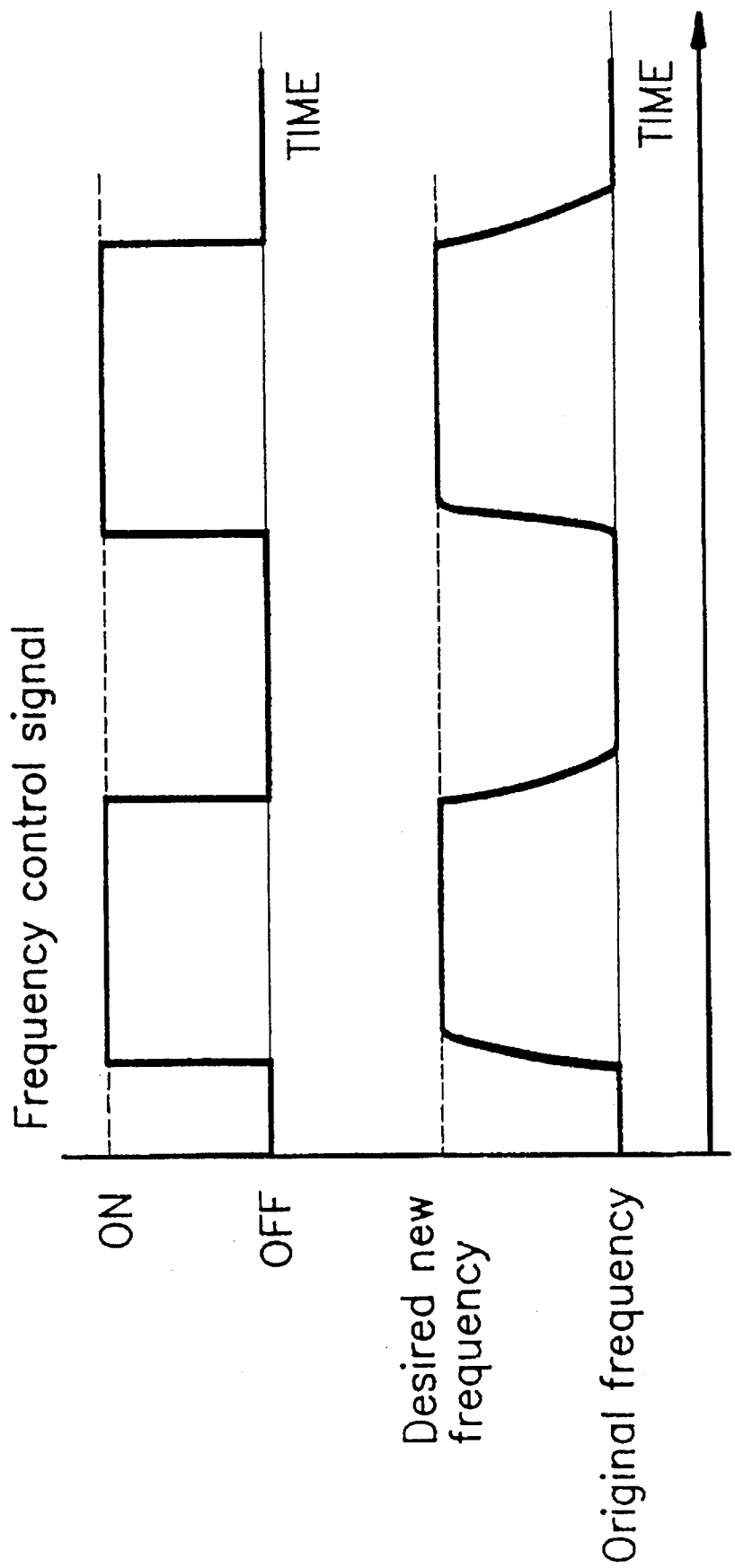

OPTICAL CONTROLLED RESONANT TUNNELING OSCILLATOR

FIELD OF THE INVENTION

The present invention relates to an optical controlled resonant tunneling oscillator, and more particularly to an optical resonant tunneling oscillator using an oscillation characteristic variation of a resonant tunneling oscillator in accordance with a negative differential resistance, a series resistance and a static capacitance varied with an intensity of light, when the light is incident on a resonant tunneling device having a double barrier quantum well structure and a method for fabricating the same.

BACKGROUND OF THE INVENTION

Since a negative differential characteristic in a double barrier quantum well was first observed, many studies on adaptation of a resonant tunneling phenomenon capable of transporting an electron at a high speed below $10^{-12}$ second in a high speed device have been accomplished.

FIG. 1 shows a current-voltage characteristic curve of a resonant tunneling diode.

As shown in FIG. 1, a resonant tunneling diode using a resonant tunneling phenomenon has a bistable characteristic having two stable states against a load line due to a negative differential characteristic that a current therethrough decreases regardless of an increase of an applied voltage.

The bistable characteristic has been applied to a memory device, a logic circuit and a high frequency oscillator. Many studies on the bistable characteristic have been accomplished and an oscillation characteristic is disclosed in Appl. Phys. Lett., 58, pp 2291, 1991 by E.R. Brown et al.

The high frequency oscillation device having the resonant tunneling characteristic has an equivalent circuit diagram as shown in FIG. 2.

An input impedance ($Z_{input}$) is expressed in the following equation (1) and a cut-off frequency ($f_c$) has a value of the input impedance at the time that the real part is O and is expressed in the following equation (2). A self-resonant frequency ($f_r$) has a value of the input impedance at the time that an imaginary part is O and is expressed in the following equation (3):

$$Z_{input} = R_s + jwL_s + \frac{R_n[j/(wC)]}{-R_n - j(wC)} \quad (1)$$

$$= R_s - \frac{R_n}{1+(wR_nC)^2} +$$

$$j\left[ wL_s - \frac{wR_n^2C}{1+(wR_nC)^2} \right]$$

$$f_c = \frac{1}{2\pi R_n C} \sqrt{\frac{R_n}{R_s} - 1} \quad (2)$$

$$f_r = \frac{1}{2\pi R_n C} \sqrt{\frac{R_n^2 C}{R_s} - 1} \quad (3)$$

The constant, $R_s$ designates a series resistance, $R_n$ negative differential resistance of a tunneling diode, C a static capacitance of the diode, $L_s$ an inductance of a packaged circuit, respectively.

Accordingly, it is noted that a negative differential resistance, a series resistance, a status capacitance and a inductance of a circuit are the primary factors for determining the oscillation characteristic of an oscillator. $L_s$ of the primary factors is determined by the process of manufacturing and it is difficult to change the value of $L_s$ of the previously fabricated oscillator by an external factor.

As shown in FIG. 3, in order to modulate the oscillation characteristic, the prior oscillator having a high frequency characteristic inputs a frequency control signal, synthesizes the frequency of the oscillator and the frequency of the control signal and outputs the synthesized frequency.

That is, because the prior resonant tunneling oscillator utilizes a frequency control method for modulating an oscillation characteristic by an ON/OFF electric signal, restrictions are imposed on a frequency modulation at a ultra-high speed and simplification of a system.

SUMMARY OF THE INVENTION

Accordingly, the present invention is to solve above problems and it is an object of the present invention to provide an optical controlled resonant tunneling oscillator capable of processing a signal at an ultra-high speed and simplifying a system by controlling a frequency of a resonant tunneling oscillator in response to an intensity of light and a method for fabricating the same.

These and other objects and features of the present invention can be achieved by providing an optical controlled resonant tunneling oscillator capable of controlling an oscillator characteristic thereof in accordance with an intensity of light radiated in depletion layers through a window layer, comprising a semi-insulated substrate made of GaAs; a buffer layer made of GaAs doped with an impurity in a high concentration, first and second semiconductor layers serving as an accumulation region, third and fourth semiconductor layers as the depletion layer successively formed over the semi-insulated substrate in a forward mesa structure; first and seconds barrier layers formed between the second and third semiconductor layers in a double barrier quantum well structure; a well layer formed at an interface between the first and second barrier layers; and the window layer formed over the fourth semiconductor layer and grown from a material having a wideband gap so as to make the light incident on the surface thereof nearly absorbed in the depletion layer.

The present invention provides a method for fabricating an optical controlled resonant tunneling oscillator, comprising the steps of successively growing a buffer layer made of $n^+$-type GaAs, first and second semiconductor layers, and a window layer over a semi-insulated substrate made of GaAs with a molecular beam epitaxy growth; mesa-etching to the portion of the buffer layer using a photoresist pattern as a mask, forming openings in the photoresist and exposing the buffer layer so as to form ohmic contacts; depositing a multi-metal pattern of AuGe/Ni/Au in the openings; etching to the portion of the underlying substrate so as to isolate the oscillator; depositing an insulation layer over the whole surface of the substrate; etching the insulation layer, thereby forming contact holes on the multi-metal patterns; forming metal patterns and annealing for ohmic contact and for improving an adhesion force of the metal patterns for a bonding pad.

BRIEF DESCRIPTION OF THE DRAWINGS

FIG. 3 is a waveform diagram of a conventional high frequency oscillator;

FIG. 4 is a configuration diagram of an optical controlled resonant tunneling oscillator using a double barrier quantum well in accordance with the present invention.

DETAILED DESCRIPTION OF THE PREFERRED EMBODIMENTS

Referring to FIG. 4, there is shown a schematic diagram of an optical controlled resonant tunneling oscillator using a double barrier quantum well structure in accordance with the invention.

Figure 1:
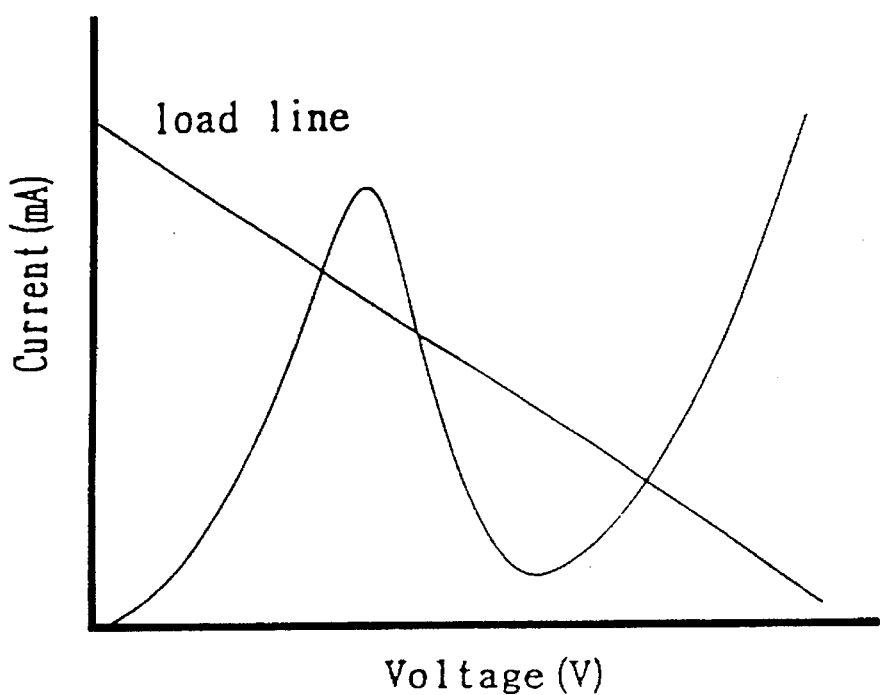
FIG. 1 is a diagram of a conventional current-voltage characteristic curve of a resonant tunneling diode.
Figure 2:
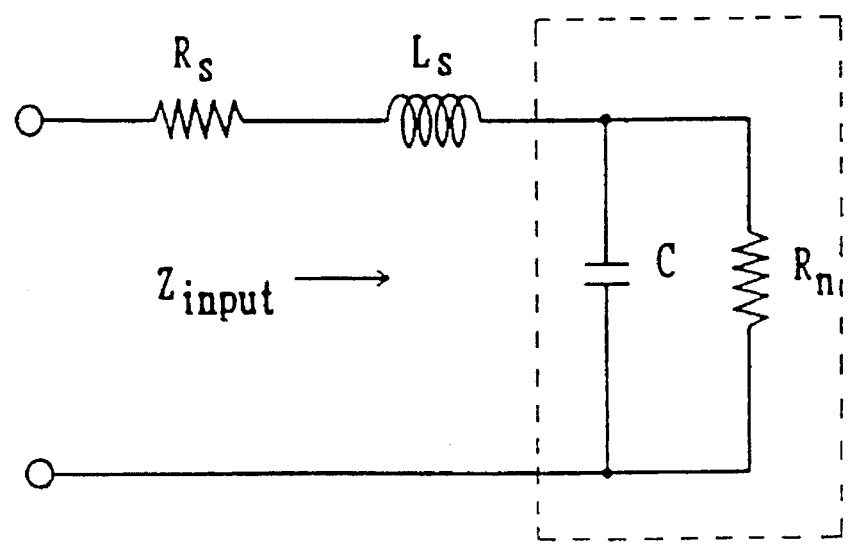
FIG. 2 is an equivalent circuit diagram of FIG. 1.
Figure 4A:
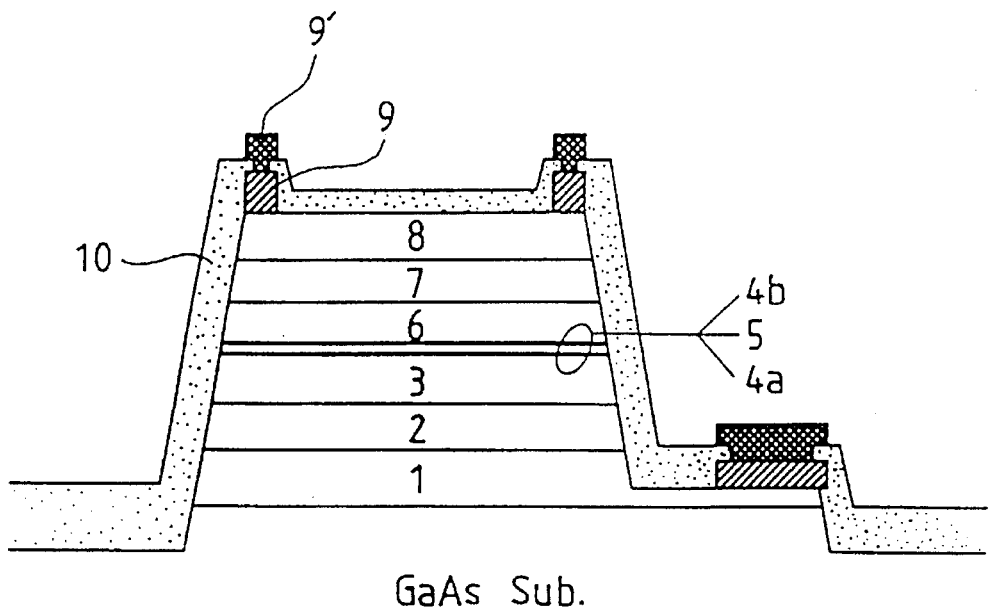
FIG. 4A is a sectional view.
Figure 4B:
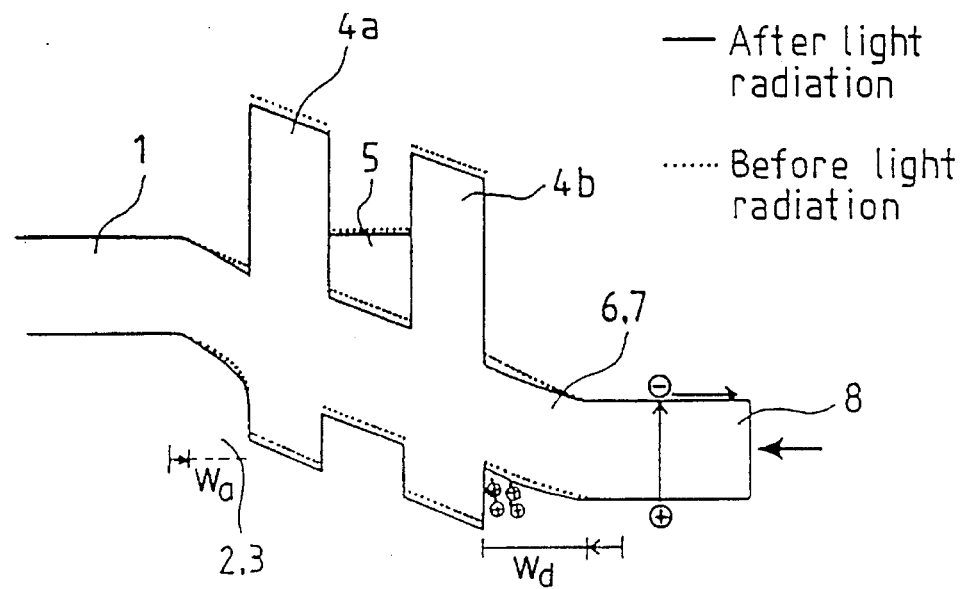
FIG. 4B is a band diagram.

FIG. 4A shows a sectional view of an optical controlled resonant tunneling oscillator in FIG. 4 and FIG. 4B shows a band diagram when a voltage is applied to a positive electrode of FIG. 4A.

Referring to drawing, the optical controlled resonant tunneling oscillator has mesa structure formed from a buffer layer 1 made of $n^+$-type GaAs, a fourth semiconductor layer 7 made of n-type GaAs and a window layer 8 made of $n^+$-type AlGaAs are successively formed on a semi insulating substrate of GaAs and a first barrier layer 4a and a second barrier layer 4b having a double barrier structure are formed between the second semiconductor layer 3 and the third semiconductor layer 6, and a well layer 5 is formed at an interface between the first and the second barrier layers 4a and 4b.

When light is illuminated on the window layer of the optical controlled resonant tunneling oscillator as described above, electron-hole pairs are created in the third and fourth semiconductor layers 6 and 7.

At this time, if a positive voltage is applied to an electrode 9 on the mesa structure, each electron-hole pair is separated into an electron and a hole. As shown in FIG. 4B, electrons flow to a collector. Some holes are accumulated in a barrier of a collector side against electrons and the rest of holes flow to an emitter against electrons by a resonant tunneling or a non-resonant tunneling.

Conductivity of the lightly doped fourth semiconductor layer 7 and the second semiconductor layer 6 is increased by optically created electrons, so that a series resistance is decreased. Space charges accumulate in the well layer 5 due to holes accumulated in the barrier of the collector side so as to preserve charge neutrality, thereby causing a potential distribution of a double barrier quantum well to be abruptly changed.

The static capacitance C is expressed by the following equation. Herein, 1 is a dielectric constant, A an area of a device and d a width $W_s$ of the accumulation layer, a width Wd of a depletion region, and a width of a barrier and the well respectively.

$$C = \epsilon A/d$$

The capacitance is determined by the dielectric constant, the area of the device, the width $W_s$ of the accumulation layer, the $W_d$ of the depletion layer, and a width of a barrier and the well.

As the potential distribution of the double barrier quantum well structure is changed by the accumulated holes near the barrier of the collector side and reduction of the series resistance, it should satisfy a condition of resonant tunneling at a lower voltage than before the illumination of the light.

Figure 5:
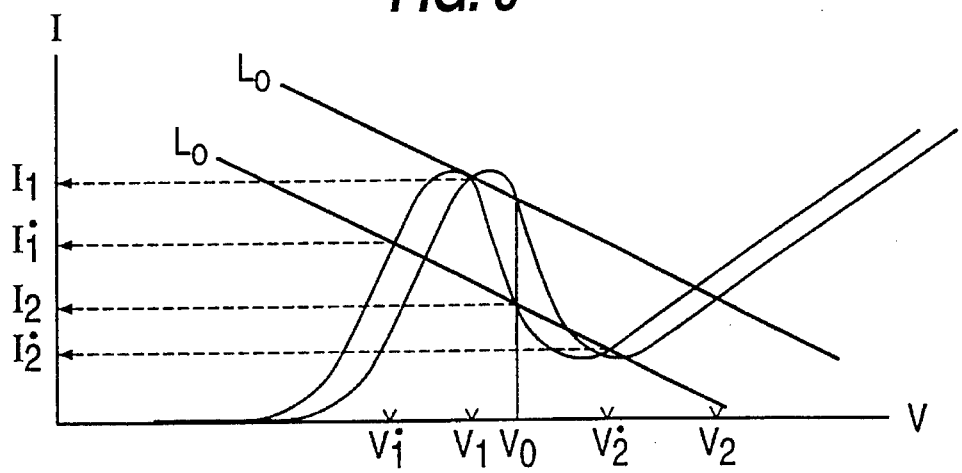
FIG. 5 is a diagram of a DC current-voltage characteristic curve of an optical controlled resonant tunneling oscillator in accordance with the present invention.

Accordingly, as shown in FIG. 5, the DC current-voltage characteristic curve of the optical controlled resonant tunneling device is shifted at a lower voltage under the light illumination.

Thus, when the incident light illuminated on the window layer of the oscillator, the negative differential resistance $R_n$ is changed from $o(V_2-V_1)/(I_2-I_1)$ to $(V_2'-V_1')/(I_2'-I_1')$ against the load line LO.

However, in general, when the case that the applied voltage is smaller than the peak voltage is compared with the case where the applied voltage is larger than the valley voltage, the DC current-voltage characteristic curve of the tunneling oscillator has a larger slope under the condition of the former than that of the latter.

Accordingly, when the current-voltage curve is shifted to the lower voltage due to the illumination of the light, the variation of the voltage $(V_2-V_2')$ is larger than the variation of the current $(I_2-I_2')$ in the region where the applied voltage is larger than the peak voltage, thereby decreasing the negative resistance $R_n$ against the applied voltage Vo and the load line Lo.

As the result, if the incident light having a higher energy than the energy bandgap of the semiconductor layer of the depletion region is illuminated on the surface of the resonant tunneling device, the series resistance is reduced due to the photogenerated electrons and holes and the static capacitance and the negative differential resistance are increased. Accordingly, the light is radiated on the surface of the resonant tunneling device, the oscillation frequency is changed by the equations (2) and (3).

The output characteristic of the resonant tunneling oscillator is determined by the self-resonant frequency of the equation (3), so that the frequency of the device is reduced by the illumination of the light.

Figure 6:
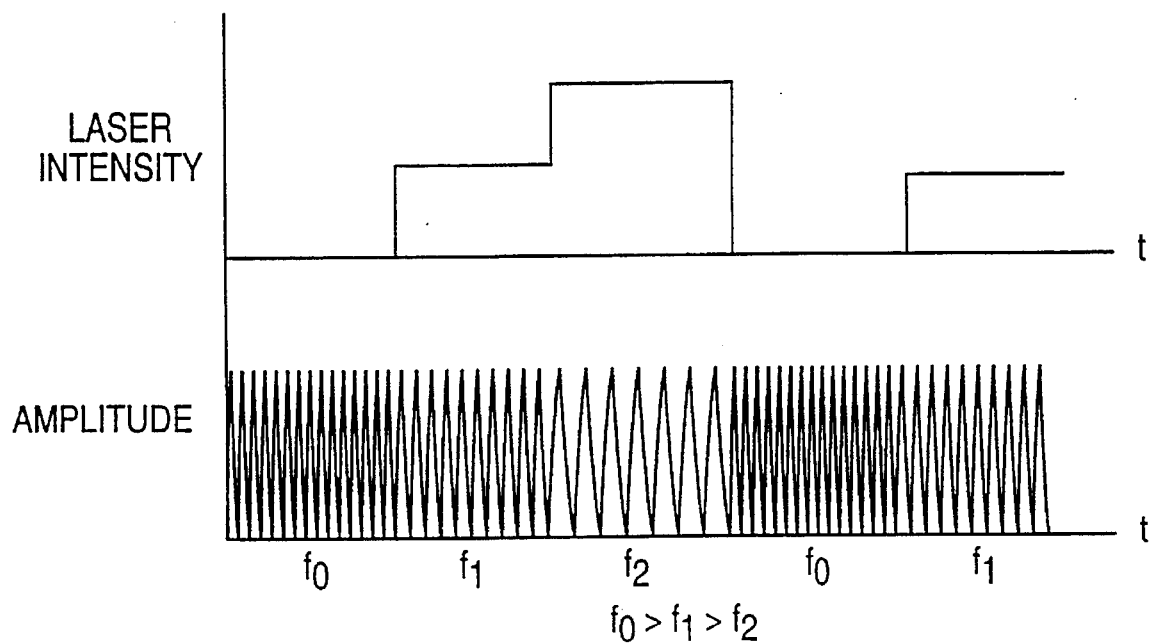
FIG. 6 is a waveform diagram of frequency modulation of an optical controlled resonant tunneling oscillator in accordance with the present invention.

The frequency characteristic can be controlled in accordance with the intensity of the light as shown in FIG. 6 before the generation of electron-hole pairs becomes a saturated state.

As compared with the conventional method that modulates the frequency by an ON/OFF electrical control signal, the frequency of the optical resonant tunneling oscillator can modulate the frequency over 2 or 3 levels in response to the intensity of the control light, thereby simplifying the system and it controls the resonant tunneling at the high speed by the light, thereby processing the signal at the ultra-high speed of tens to hundreds GHz.

FIG. 7A to 7H are sectional views, respectively, illustrating a method for fabricating an optical controlled resonant tunneling oscillator in accordance with the present invention.

In accordance with this method, first, the buffer layer 1 on $n^+$-type GaAs doped with an n-type impurity in a concentration of $4 \times 10^{18} cm^{-3}$ and the second semiconductor layer 3 made of the undoped GaAs, are successively grown to a thickness of 10000 Å over a semi-insulated substrate made of GaAs. Over the buffer layer 1, the first gap layer 2 which is made of $n^+$-type GaAs doped with an n-type impurity in a concentration of $4 \times 10^{17} cm^{-3}$ and the second semiconductor 3 made of the undoped GaAs, are successively grown to a thickness of 1000 Å and 100 Å, respectively.

The double barrier quantum well structure is achieved by symmetrically growing the first and the second barrier layers 4a and 4b, respectively, to a thickness of 40 Å and the well layer 5 made of GaAs and serving as a quantum well, is grown between the first and second barrier layers 4a and 4b.

The third semiconductor layer 6 and the fourth semiconductor layer 7 are successively grown over the second barrier layer 4b. The third semiconductor layer 6 is formed of the undoped GaAs having a thickness of 500 Å and the fourth semiconductor layer 7 is formed of n-type GaAs highly-doped with an n-type impurity in a concentration of $4 \times 10^{17}$ cm$^{-3}$ and has a thickness of 1000 Å.

In order to further enhance the voltage drop in the double barrier quantum well in response to the radiation of the light enlarging the length of the first to the fourth forbidden bandgaps when the voltage is applied.

Subsequently, the window layer 8 is grown to a thickness of 5000 Å over the fourth semiconductor layer 7. The window layer is made of $Al_{0.15}Ga_{0.85}As$ which is heavily doped with an n-type impurity in a concentration of $2 \times 10^{18}$ cm$^{-3}$ and has a wider band gap making the incident light absorbed not in the window layer but in the first to fourth semiconductor layers.

Figure 7A:
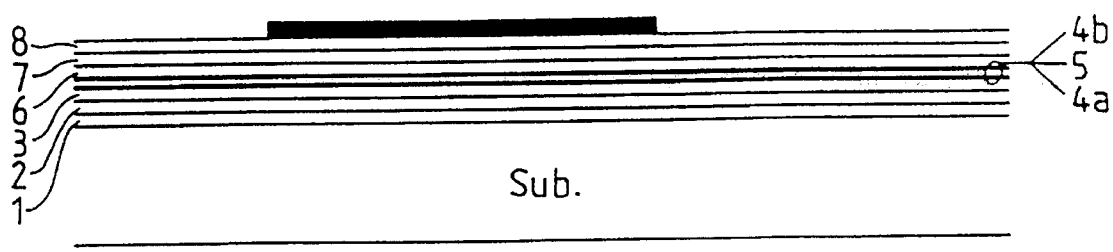
FIG. 7A to 7H are cross sectional diagrams, respectively, illustrating a method for fabricating an optical controlled resonant tunneling oscillator in accordance with the present invention.

Accordingly, the sectional structure as shown in FIG. 7A is obtained.

Figure 7B:
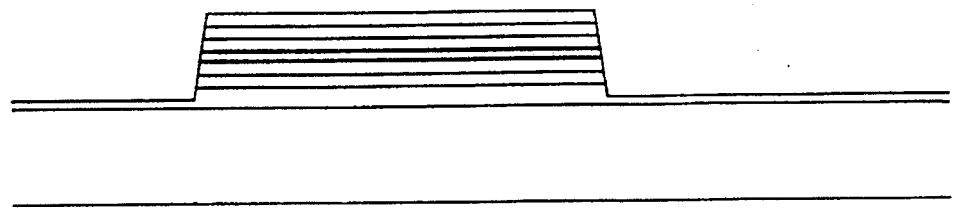

As shown in FIG. 7B, for formation of the mesa structure using the photoresist pattern, the window layer 8, the fourth and third semiconductor layers 7 and 6, the second barrier layer 4b, the well layer 5, the first barrier layer 4a, the second and first semiconductor layers 3 and 2 and the portion of the buffer layer 1 are sequentially etched using an etchant solution of $H_3PO_4:H_2O_2:H_2O$ mixed at the volume ratio of at the room temperature.

Figure 7C:
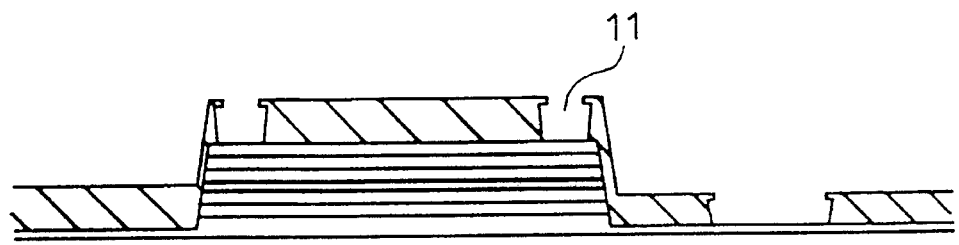

As shown in FIG. 7C, a photoresist film is first coated over the whole surface and then the openings 11 are formed on the edge portion of the mesa structure so as to make the light sufficiently illuminating of the underlying window layer and uniformly apply the bias voltage.

Figure 7D:
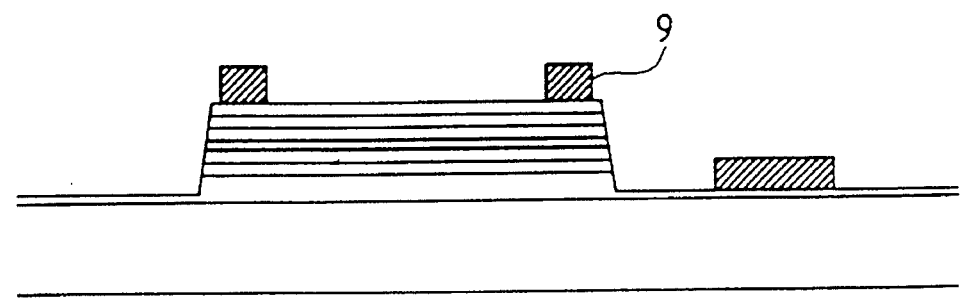

As shown in FIG. 7D, for formation of ohmic contacts on the openings 11, 88Au:12Ge/Ni/Au are deposited using a thermal deposition method to a thickness of 1500 Å/500 Å/3000 Å, respectively.

The deposited layer are subjected to a lift-off by dipping in acetone so as to form the metal pattern 9 as shown in FIG. 7D.

Figure 7E:
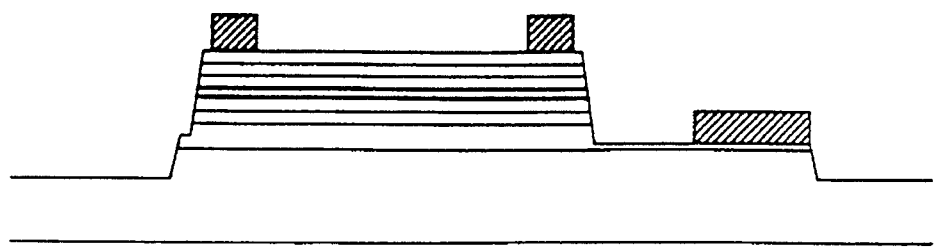

Referring to FIG. 7E, in order to isolate between the devices and reduce the static capacitance due to a wire bonding pad, the photo-etching process is carried out in a mesa etching manner as shown in FIG. 7B so as to form the photoresist pattern. Then the exposed buffer layer 1 and the type underlying semi-insulated substrate are etched using the above mesa etching solution.

The substrate is partially etched to a predetermined depth.

Figure 7F:
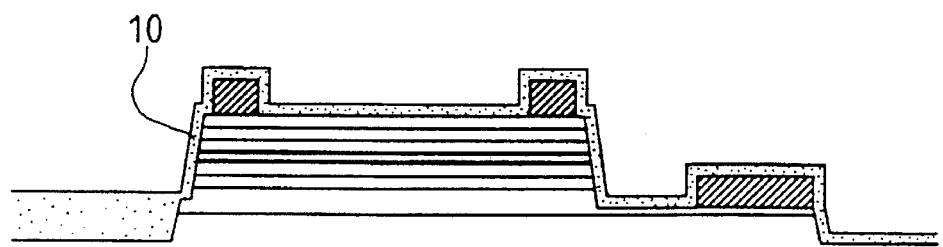

Referring to FIG. 7F, the $SiO_2$ layer 10 is deposited over the whole surface to a thickness of about 3000 Å using a low temperature chemical vapor deposition or plasma chemical vapor deposition.

Figure 7G:
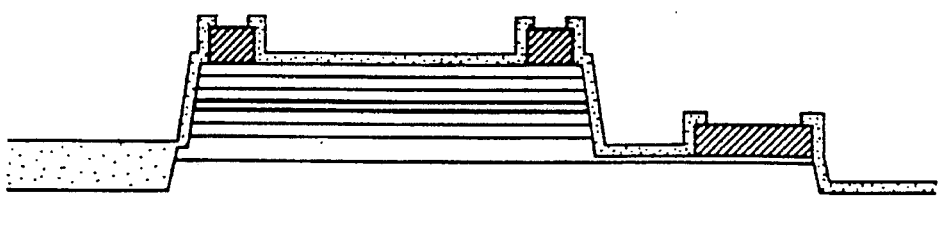

Referring to FIG. 7G, for connection of an ohmic contact metal and a bonding pad metal, a photoresist film over the metal patterns 9 using a buffered oxide etchant BOE.

Figure 7H:
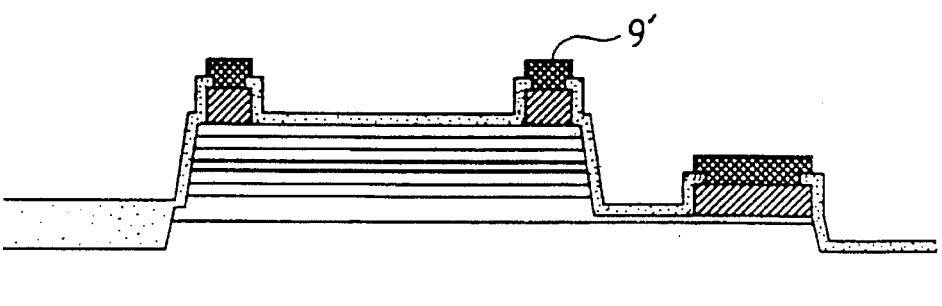

Referring to FIG. 7H, Ti/Au are respectively deposited over the whole surface to a thickness of 500 Å/3000 Å using an electron beam vacuum deposition method.

The Ti/Au layer are subjected to a lift-off process by dipping in an acetone so as to form the metal patterns 9' for a bonding pad on the metal patterns 9.

Subsequently, the metal patterns 9 for an ohmic contact are subjected to an annealing using a rapid thermal annealing.

After the formation of the metal pattern for a bonding pad, the annealing is carried out so as to enhance an adhesion of the metal pattern for a bonding pad, so that the optical controlled resonant tunneling oscillator of this invention can be fabricated.

According to the present invention, the high frequency characteristic of the resonant tunneling can be modulated in response to the intensity of the light. Therefore, an optical resonant tunneling oscillator can exhibit the optical controlled oscillation characteristic of high speed, as compared with a conventional frequency modulation method.

Thus, an optical resonant tunneling oscillator of the present invention controls the high speed of the resonant tunneling by the light, thereby processing the signal at the high speed of ten to hundreds GHz.

Furthermore, the frequency can be modulated to 2 or 3 levels in response to the intensity of the light, thereby simplifying the system.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An optical controlled resonant tunneling oscillator comprising:

a semi-insulating substrate;

a buffer layer of an n$^+$-type GaAs doped with a high concentration and first and second semiconductor layers serving as first and second spacer layers successively formed over the semi-insulating substrate;

a first barrier layer, a well layer and a second barrier layer successively formed over the second semiconductor layer for forming a double barrier quantum well structure;

third and fourth semiconductor layers serving as third and fourth spacer layers successively formed over the second barrier layer; and a window layer formed over the fourth semiconductor layer; and wherein said window layer has a bandgap so as to permit absorption of incident light in the first to the fourth semiconductor layers.

2. An optical controlled resonant tunneling oscillator as claimed in claim 1, wherein:

the oscillator is controllable by more than 2 levels in accordance with a variation of a series resistance, a negative differential resistance and a static capacitance in response to the intensity of the light.

3. An optical controlled resonant tunneling oscillator as claimed in claim 1, wherein:

the first and second barrier layers are made of an undoped AlAs having a thickness of 40 Å and the well layer made of an undoped GaAs having a thickness of 45 Å.

4. An optical controlled resonant tunneling oscillator as claimed in claim 1, wherein:

the window layer is made of $A_{0.15}Ga_{0.85}As$ doped with an n-type impurity of a concentration of $2 \times 10^{18}$ cm$^{-3}$ and having a bandgap and a thickness of about 5000 Å.

5. An optical controlled resonant tunneling oscillator as claimed in claim 1, wherein:

the second and third semiconductor layers are grown from undoped GaAs and have a thickness of 100 Å and 500 Å, respectively, and the first and fourth semiconductor layers are doped with an n-type impurity.

* * * * *